United States Patent
Perzlmaier et al.

(10) Patent No.: US 9,859,463 B2
(45) Date of Patent: Jan. 2, 2018

(54) OPTOELECTRONIC SEMICONDUCTOR DEVICE

(71) Applicant: OSRAM Opto Semiconductors GmbH, Regensburg (DE)

(72) Inventors: Korbinian Perzlmaier, Regensburg (DE); Fabian Kopp, Regensburg (DE); Christian Eichinger, Wenzenbach (DE); Björn Muermann, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/310,558

(22) PCT Filed: May 29, 2015

(86) PCT No.: PCT/EP2015/062009
§ 371 (c)(1),
(2) Date: Nov. 11, 2016

(87) PCT Pub. No.: WO2015/189056
PCT Pub. Date: Dec. 17, 2015

(65) Prior Publication Data
US 2017/0092808 A1 Mar. 30, 2017

(30) Foreign Application Priority Data
Jun. 12, 2014 (DE) .................. 10 2014 108 300

(51) Int. Cl.
*H01L 33/14* (2010.01)
*H01L 33/62* (2010.01)
*H01L 33/22* (2010.01)

(52) U.S. Cl.
CPC .............. *H01L 33/14* (2013.01); *H01L 33/22* (2013.01); *H01L 33/62* (2013.01)

(58) Field of Classification Search
CPC combination set(s) only.
See application file for complete search history.

(56) References Cited

U.S. PATENT DOCUMENTS 6,620,238 B2 9/2003 Tsuda et al.
7,179,667 B2 2/2007 Okagawa et al.
(Continued)

FOREIGN PATENT DOCUMENTS

CN 102479903 A 5/2012
DE 103 46 605 A1 3/2005
(Continued)

*Primary Examiner* — Mamadou Diallo
(74) *Attorney, Agent, or Firm* — DLA Piper LLP (US)

(57) ABSTRACT

An optoelectronic semiconductor device has a semiconductor body including a semiconductor layer sequence with an active region that generates radiation, a semiconductor layer and a further semiconductor layer, wherein the active region is arranged between the semiconductor layer and the further semiconductor layer, a current spreading layer is arranged on a radiation exit face of the semiconductor body, the current spreading layer connects electrically conductively with a contact structure for external electrical contacting of the semiconductor layer, in a plan view of the semiconductor device the current spreading layer adjoins the semiconductor layer in a connection region, and the current spreading layer includes a patterning with a plurality of recesses through which radiation exits the semiconductor device during operation.

15 Claims, 6 Drawing Sheets

(56) References Cited

U.S. PATENT DOCUMENTS

| | | |
|---|---|---|
| 2010/0072487 A1 | 3/2010 | Tsai et al. |
| 2010/0197055 A1 | 8/2010 | Tanaka et al. |
| 2011/0025251 A1 | 2/2011 | Arai et al. |
| 2011/0193123 A1 | 8/2011 | Moon et al. |
| 2014/0301179 A1* | 10/2014 | Rich .................. G06T 9/00 369/275.4 |

FOREIGN PATENT DOCUMENTS

| | | |
|---|---|---|
| EP | 2 226 859 A2 | 9/2010 |
| JP | 2010-74182 A | 4/2010 |

* cited by examiner

OPTOELECTRONIC SEMICONDUCTOR DEVICE

TECHNICAL FIELD

This disclosure relates to an optoelectronic semiconductor device.

BACKGROUND

In radiation-generating semiconductor devices such as, for example, light-emitting diodes, contact layers are often applied over a large area on a side on which the radiation exits during operation to bring about the largest possible area of charge carrier injection. However, even when radiation-transmissive materials, for example, transparent conductive oxides (TCOs) are used, a significant proportion of the light is lost through absorption on passage through such a contact layer.

It could therefore be helpful to provide an optoelectronic semiconductor device distinguished by reduced absorption losses at the same time as good charge carrier injection.

SUMMARY

We provide an optoelectronic semiconductor device having a semiconductor body including a semiconductor layer sequence with an active region that generates radiation, a semiconductor layer and a further semiconductor layer, wherein the active region is arranged between the semiconductor layer and the further semiconductor layer, a current spreading layer is arranged on a radiation exit face of the semiconductor body, the current spreading layer connects electrically conductively with a contact structure for external electrical contacting of the semiconductor layer, in a plan view of the semiconductor device the current spreading layer adjoins the semiconductor layer in a connection region, and the current spreading layer includes a patterning with a plurality of recesses through which radiation exits the semiconductor device during operation.

We also provide an optoelectronic semiconductor device having a semiconductor body including a semiconductor layer sequence with an active region that generates radiation, a semiconductor layer and a further semiconductor layer, wherein the active region is arranged between the semiconductor layer and the further semiconductor layer, a current spreading layer is arranged on a radiation exit face of the semiconductor body, the current spreading layer connects electrically conductively to a contact structure for external electrical contacting of the semiconductor layer, in a plan view of the semiconductor device, the current spreading layer adjoins the semiconductor layer in a connection region, the current spreading layer includes a patterning with a plurality of recesses through which radiation exits the semiconductor device during operation, and the patterning includes trench-shaped recesses with ribs of the current spreading layer extending between the trench-shaped recesses and a crosswise extent of the trench-shaped recesses decreases at least in places as the distance from the contact structure increases.

DETAILED DESCRIPTION

Our optoelectronic semiconductor device generates electromagnetic radiation in particular when the semiconductor device is in operation.

The semiconductor device may have a semiconductor body with a semiconductor layer sequence. The semiconductor layer sequence comprises an active region that generates radiation. The active region is, for example, provided in the ultraviolet, visible and/or infrared region of the spectrum. For example, the active region is arranged between a semiconductor layer and a further semiconductor layer of the semiconductor layer sequence. The semiconductor layer and the further semiconductor layer are conveniently different from one another at least in places with regard to conduction type such that the active region is situated in a pn junction.

The semiconductor body further comprises a radiation exit face extending parallel to a main plane of extension of the semiconductor layers of the semiconductor layer sequence. The radiation exit face terminates the semiconductor body in a vertical direction, i.e., perpendicular to a main plane of extension of the semiconductor layers of the semiconductor layer sequence. For example, the semiconductor layer forms the radiation exit face.

The optoelectronic semiconductor device may comprise a current spreading layer. The current spreading layer is arranged in particular outside the semiconductor body, for example, on the radiation exit face. The current spreading layer is, for example, configured to be radiation-transmissive to the radiation generated in the semiconductor device. For example, the current spreading layer contains a TCO material.

The optoelectronic semiconductor device may comprise a contact structure for external electrical contacting of the semiconductor layer. The contact structure in particular connects electrically conductively to the current spreading layer. For example, the semiconductor device comprises a further contact structure for external electrical contacting of the further semiconductor layer. Through application of an electrical voltage between the contact structure and the further contact structure, charge carriers may be injected from different sides into the active region and there recombine with emission of radiation.

In a plan view of the semiconductor device, the current spreading layer may adjoin the semiconductor layer in a connection region. The connection region defines that region on the radiation exit face in which charge carrier injection takes place from the current spreading layer into the semiconductor layer. In the plan view, the current spreading layer extends in particular within an enveloping outer border of the connection region. In case of doubt, an enveloping outer border is considered to be the imaginary course of an elastic band extending along the outer faces of the current spreading layer.

The current spreading layer may comprise a patterning with a plurality of recesses, in particular within an enveloping outer border of the connection region. Within the outer border of the connection region, the current spreading layer is thus not arranged with a homogeneous thickness over the entire area of the radiation exit face. In particular, when the semiconductor device is in operation, radiation exits from the semiconductor device through the recesses. Regions in which the semiconductor body is covered by the contact structure and in which there is no underlying current spreading layer are, on the other hand, not considered to be recesses for our purposes. Likewise, regions in which the radiation exit face itself has an indentation, for example, to electrically contact the further semiconductor layer by the further contact structure, do not constitute recesses of the current spreading layer in the connection region.

The optoelectronic semiconductor device may comprise a semiconductor body comprising a semiconductor layer sequence with an active region that generates radiation, a semiconductor layer and a further semiconductor layer. The active region is arranged between the semiconductor layer and the further semiconductor layer. A current spreading layer is arranged on a radiation exit face of the semiconductor body. The current spreading layer connects electrically conductively to a contact structure for external electrical contacting of the semiconductor layer. In plan view onto the semiconductor device, the current spreading layer adjoins the semiconductor layer in a connection region. The current spreading layer comprises a patterning with a plurality of recesses through which radiation exits the semiconductor device during operation.

The recesses are formed in particular within an enveloping outer border of the connection region.

The recesses comprise a lengthwise extent, for example, in a longitudinal direction in which they have a maximum extent. Furthermore, the recesses have a crosswise extent perpendicular to the longitudinal direction. In circular recesses, the lengthwise extent is equal to the crosswise extent.

The crosswise extent may be conformed to a transverse conductivity of the semiconductor layer such that, in a plan view of the semiconductor device, charge carriers are injected via the semiconductor layer into the active region at every location in the recesses when the semiconductor device is in operation. The crosswise extent of the recesses is thus merely of such magnitude that the active region is also completely energized within the recesses in plan view onto the semiconductor device.

In particular, it is ensured that regions do not form as a result of the recesses in the active region which are not energized and cause radiation absorption. Such absorption effects might more than compensate for the reduced absorption in the current spreading layer due to the recesses. In the connection region the maximum distance to the current spreading layer is thus so small at every location in the cutouts that charge carriers can bridge this distance due to the transverse conductivity of the semiconductor layer.

The recesses may at least partly be elongate when viewed in a plan view of the semiconductor device. For example, the recesses have a lengthwise extent in the longitudinal direction which is at least 20% greater than the crosswise extent in a transverse direction extending perpendicular to the longitudinal direction. Even in a lengthwise extent of the recesses which is very much greater than the crosswise extent of the recesses, efficient charge carrier injection into the active region may take place in the recesses. For example, the extent in the longitudinal direction is at least twice as great or at least five times as great as the crosswise extent. The recesses may, for example, have an elliptical or trench-like basic shape. For example, a plurality of recesses configured in the shape of trenches and extending parallel to one another form a comb-shaped structure. The recesses, in particular trench-like recesses, may also extend as far as the outer border of the connection region. Alternatively, the recesses may extend completely inside the connection region when viewed in plan view onto the semiconductor device. In recesses of elongate configuration, the longitudinal direction preferably extends in a local preferential direction of the current in the current spreading layer. For example, the longitudinal directions of the recesses extend along the shortest connection between the contact structure and the further contact structure at the respective location. In this way, the current path inside the current spreading layer and the series resistance resulting from the current spreading layer are minimized.

The patterning may comprise trench-like recesses with ribs of the current spreading layer extending between the trench-like recesses. In particular, a crosswise extent of the trench-like recesses decreases at least in places as the distance from the contact structure increases. For example, the crosswise extent of the trench-like recesses decreases continuously. For example, a crosswise extent of the trench-like recesses and/or a crosswise extent of the ribs varies in the connection region by at least 20%, preferably by at least 50%.

An area of the recesses and/or a center-to-center distance of the recesses may vary when viewed in a plan view of the semiconductor device. In other words, coverage of the semiconductor layer with material of the current spreading layer varies in the lateral direction. In the event of a variation in the area of the recesses, preferably all the recesses are adapted, in terms of their crosswise extent, to the transverse conductivity of the semiconductor layer such that, in the plan view of the semiconductor device, charge carrier injection into the active region takes place at every location within the recesses.

In case of doubt, the spacing of the respective centroids of the recesses is considered to be the center-to-center distance of the recesses.

As the distance from the closest contact structure increases, in particular the area of the recesses decreases and/or the center-to-center distance of the recesses increases. Regions arranged close to the contact structure are thus covered with a smaller volume of the material of the current spreading layer than regions arranged further away from the contact structure.

The connection region may comprise a first square area and a second square area. The first square area and the second square area each constitute sub-regions of the current spreading layer, wherein the first square area and the second square area are of equal size and each have an edge length greater than or equal to twice the crosswise extent of the recesses in the first square area. When viewed in a plan view of the semiconductor device, the recesses in the first square area fill at least 20% of the first square area and the recesses in the second square area fill at most 10% of the second square area. The first square area and the second square area are each arranged completely within the outer border of the connection region. The first square area and the second square area may in particular serve as a measure of the variation in coverage of the connection region with material of the current spreading layer.

In this case, the first area is in particular arranged closer to a closest point of the contact structure than the second area. In particular, the first area may be situated in a current path between the closest point of the contact structure and the second area.

The recesses may not extend completely through the current spreading layer in a vertical direction. The current spreading layer thus adjoins the semiconductor layer even in the region of the recesses. Large-area charge carrier injection into the semiconductor layer is thus simplified.

The recesses may take the form of cutouts extending right through the current spreading layer. Such recesses are particularly simple to produce. Furthermore, the radiation generated in the active region during operation does not have to pass through any material of the current spreading layer in the region of the cutouts. The fraction of the radiation absorbed in the current spreading layer is thus reduced.

In a plan view of the semiconductor device, the patterning contains optical information. The optical information may, for example, take the form of one or more characters and/or symbols. The optical information is preferably configured such that it is distinguishable under a light microscope.

The patterning may comprise at least one first recess and one second recess, wherein the first recess and the second recess differ from one another in their base area when viewed in the plan view of the semiconductor device. For example, the first recess and the second recess have a different shape and/or a different area.

In particular, the patterning comprises a plurality of first recesses and a plurality of second recesses, wherein information is encoded by the first recesses and the second recesses. For example, the information may be digitally encoded, wherein the first recesses represent a digital zero and the second recesses a digital one or vice versa. Furthermore, information may be encoded in the form of a barcode by trench-like recesses.

The information may, for example, relate to production of the semiconductor device and, for example, contain details about the manufacturer or parameters during implementation of the method. The traceability of the semiconductor devices is thereby improved.

The patterning may be configured such that, in a region in which current flow locally has a preferential direction in the current spreading layer, the patterning favors lateral current flow in the preferential direction. For example, recesses of elongate construction are oriented with their longitudinal direction in the preferential direction.

The patterning may be configured such that, in a region in which a current flow is locally without a preferential direction, the patterning has no or at least no significant effect on the direction of the lateral current flow. For example, the patterning may be formed by a plurality of recesses arranged in a grid or honeycomb. Such patterning may, for example, be convenient in a region of the connection region in which the adjacent contact structure does not extend straight and, for example, has a kink or a bend.

In particular, the semiconductor device may have at least one location with a patterning having an effect on the direction of the lateral current flow and one location with a patterning having no effect on the direction of the lateral current flow.

In a region of the semiconductor device in which a current density is below 20% of the average current density, the radiation exit face may be free of the current spreading layer to increase the radiation outcoupling from the semiconductor device. A region of the semiconductor device in which, for example, due to the geometry of the contact structure and/or of the further contact structure, only comparatively slight charge carrier injection into the underlying part of the active region could be achieved even in the presence of a current spreading layer is thus deliberately kept free of the current spreading layer in this way to increase radiation outcoupling from the semiconductor device in this region.

Further configurations and convenient aspects are revealed by the following description of examples in conjunction with the figures.

Identical, similar or identically acting elements are provided with the same reference numerals in the figures.

The figures and the size ratios of the elements illustrated in the figures relative to one another are not to be regarded as being to scale. Rather, individual elements and in particular layer thicknesses may be illustrated on an exaggeratedly large scale for greater ease of depiction and/or better comprehension.

Figure 1A:
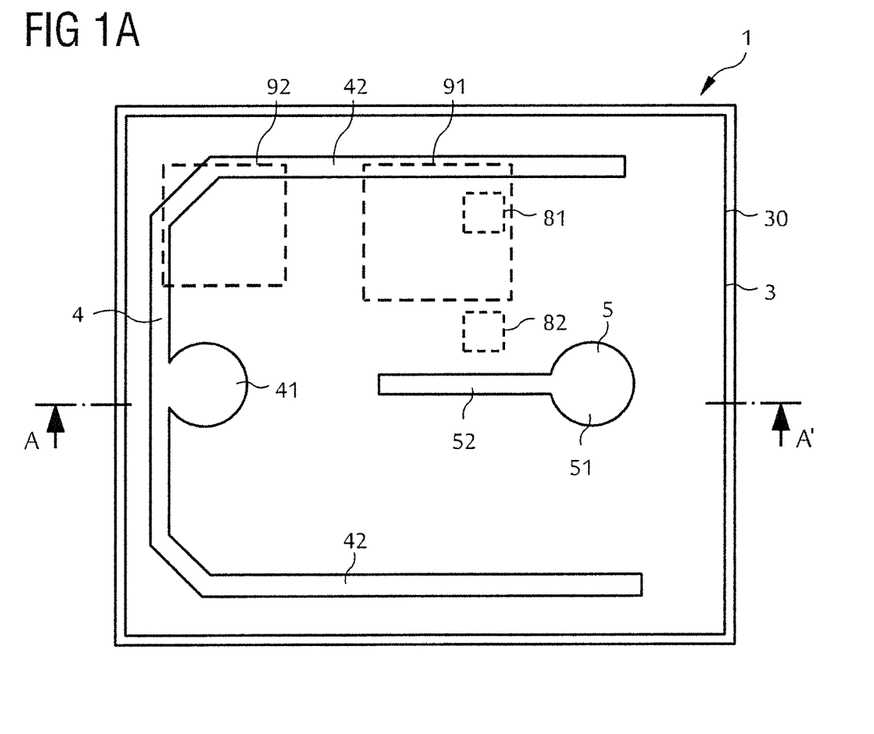
FIGS. 1A and 1B show an example of an optoelectronic semiconductor device in schematic plan view (FIG. 1A) and associated sectional view along line A-A' (FIG. 1B).

FIG. 1A shows an optoelectronic semiconductor device 1 in plan view. The semi-conductor device takes the form of a semiconductor chip, for example, a light-emitting diode.

The semiconductor device 1 comprises a semiconductor body with a semiconductor layer sequence 2. In a vertical direction extending perpendicular to a main plane of extension of the semiconductor layers of the semiconductor layer sequence, the semiconductor body is delimited by a radiation exit face 210.

Figure 1B:
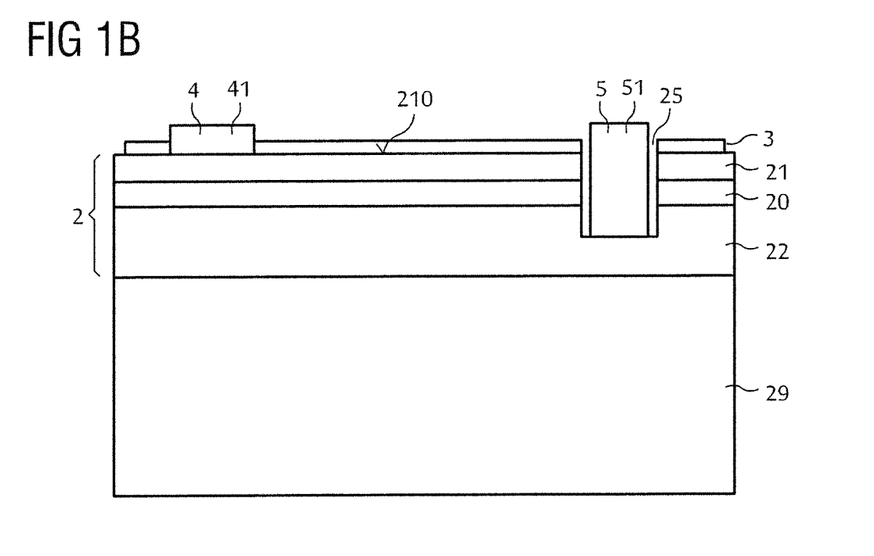

The semiconductor body with the semiconductor layer sequence 2 comprises an active region 20 that generates radiation. The active region 20 is arranged between a semiconductor layer 21 of a first conduction type and a further semiconductor layer 22 of a second conduction type different from the first conduction type. The semiconductor body, in particular the active region 20, for example, contains a III-V compound semiconductor material.

III-V compound semiconductor materials are particularly suitable for generating radiation in the ultraviolet ($Al_x In_y Ga_{1-x-y} N$) through the visible ($Al_x In_y Ga_{1-x-y} N$, in particular for blue to green radiation, or $Al_x In_y Ga_{1-x-y} P$, in particular for yellow to red radiation) as far as into the infrared ($Al_x In_y Ga_{1-x-y} As$) region of the spectrum. In each case $0 \leq x \leq 1$, $0 \leq y \leq 1$ and $x+y \leq 1$ applies, in particular with $x \neq 1$, $y \neq 1$, $x \neq 0$ and/or $y \neq 0$. Using III-V compound semiconductor materials, in particular from the stated material systems, it is additionally possible to achieve high internal quantum efficiencies in the generation of radiation.

For example, the semiconductor layer 21 contains p-conductively doped nitride compound semiconductor material, in particular $Al_x In_y Ga_{1-x-y} N$, and the further semiconductor layer contains n-conductively doped nitride compound semiconductor material.

The semiconductor layer 21 forms the radiation exit face 210. The semiconductor layer 21 is thus arranged between the radiation exit face 210 and the active region 20.

A current spreading layer 3 is arranged on the radiation exit face 210. The current spreading layer 3 is configured to be transmissive to the radiation generated in the active region and contains, for example, a TCO material for instance indium-tin oxide (ITO) or zinc oxide (ZnO).

The semiconductor device 1 further comprises a contact structure 4 for external electrical contacting of the semiconductor layer 21. The contact structure 4 comprises a contact area 41 for electrical contacting, for example, by a wire bond connection. Ribs 42 for current distribution extend from the contact area 41 over the radiation exit face 210. The arrangement of the ribs 42, the position and number thereof may be varied within broad limits. For example, the contact structure may take the form of a closed frame extending along the side faces of the semiconductor device 1.

Figure 1C:
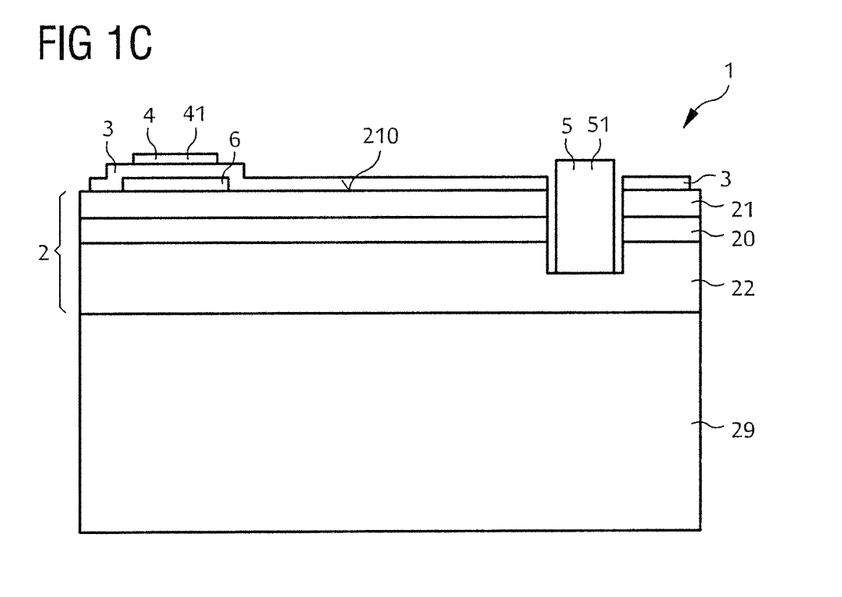
FIGS. 1C and 1D show further examples of an optoelectronic semiconductor device in schematic sectional view.
Figure 1D:
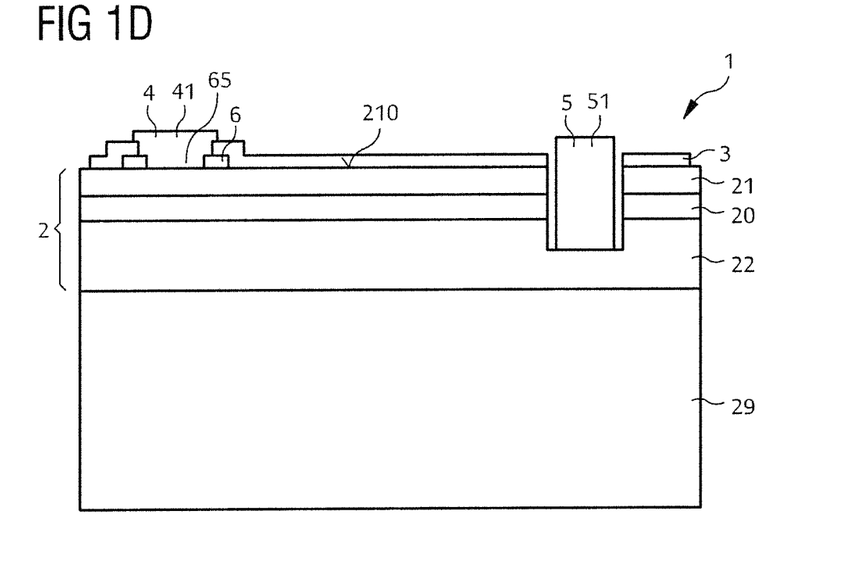

The contact area 41 is preferably configured such that charge carrier injection under the contact area is prevented or at least reduced. FIGS. 1B to 1D show various examples of this. Apart from the above, there are no other differences between these examples.

In the example shown in FIG. 1B, the contact structure directly adjoins the semiconductor layer 21. In this region a cutout is formed in the current spreading layer. The electrical contact between the contact area 41 and the semiconductor layer is deliberately configured such that substantially no direct charge carrier injection takes place from the contact area 41 into the semiconductor layer 21. In particular, there is no direct ohmic connection between the contact area and the semiconductor layer.

In the example shown in FIG. 1C, the current spreading layer 3 and the contact area 41 overlap. In particular, the current spreading layer 3 extends continuously under the contact area. To prevent charge carrier injection under the contact area, an insulation layer 6 is arranged under the contact area 41 between the current spreading layer 3 and the semiconductor layer 21. The insulation layer contains an oxide or a nitride, for example. Neither the contact area 41 nor the current spreading layer 3 directly adjoin the semiconductor layer 21 under the contact area.

In the example illustrated in FIG. 1D, the insulation layer 6 comprises a cutout 65, unlike in FIG. 1C. In plan view onto the semiconductor device 1, the contact area 41 and the cutout overlap. In the cutout 65 the contact area 41 directly adjoins the semiconductor layer 21. The contact area therefore extends in places through the current spreading layer 3 and the insulation layer 6. The electrical contact between the contact area 41 and the semiconductor layer is deliberately configured such that substantially no direct charge carrier injection takes place from the contact area 41 into the semiconductor layer 21.

Furthermore, the semiconductor device 1 comprises a further contact structure 5 with a further contact area 51 and a further rib 52. The further contact structure 5 is provided for external electrical contacting of the further semiconductor layer 22. The further contact structure 5 is arranged in a recess 25 in the semiconductor body with the semiconductor layer sequence 2. The recess 25 extends through the semiconductor layer 21 and the active region 20 into the further semiconductor layer 22.

The semiconductor layer sequence 2 is arranged on a carrier 29. An example of a suitable carrier is a growth substrate in particular for epitaxial deposition of the semiconductor layers of the semiconductor body 2, for example, by MOVPE. For example, the carrier 29 contains a radiation-transmissive material, for instance sapphire, gallium nitride or silicon carbide. Another material may however also be used, for example, silicon.

The current spreading layer 3 is arranged in a connection region 30 on the semiconductor layer 21 and adjoins the semiconductor layer. The connection region 30 extends within an outer border of rectangular basic shape. Within this border, the current spreading layer comprises a patterning 31 with a plurality of recesses 35.

Various examples of the patterning are shown on the basis of a portion 91 and a further portion 92 in FIGS. 2A to 2J and FIG. 3, respectively.

The patterning recesses are each configured such that radiation may exit through the recesses when the semiconductor device is in operation. Regions of the semiconductor device 1 in which the radiation exit face 210 is free of the current spreading layer, for example, optionally to produce electrical contacting by the contact structure 4 as shown for instance in FIG. 1B or 1D, or the further contact structure 5, on the other hand do not constitute any such recesses. No radiation can exit from the semiconductor device at these locations due to the radiation-opaque, for example, metallic configuration of the contact structure 4 and of the further contact structure 5.

The recesses 35 may extend vertically right through the current spreading layer 3 or take the form of blind holes which end in the current spreading layer. Recesses which extend through the current spreading layer, i.e., cutouts, are particularly simple to produce and minimize absorption in the regions of the recesses. In recesses not extending right through the current spreading layer, the current spreading layer also adjoins the semiconductor layer 21 in the region of the recesses. Current injection into the semiconductor layer 21 over a maximally large area is thus simplified.

Figure 2A:
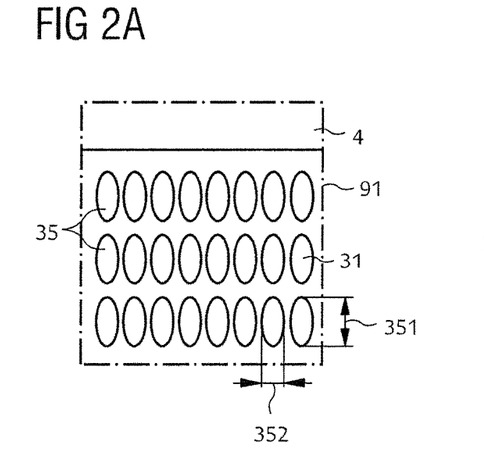
FIGS. 2A to 2J each show examples of a patterning on the basis of a portion 91 of FIG. 1A illustrated on an enlarged scale.

The crosswise extent of the recesses preferably amounts to 2 μm to 100 μm, particularly preferably 2 μm to 50 μm. The crosswise extent is here understood to mean the maximum extent perpendicular to a longitudinal direction in which the recess exhibits its maximum extent. FIG. 2A shows by way of example a lengthwise extent 351 and a crosswise extent 352 for elliptical recesses 35.

The maximum crosswise extent of the recesses over which complete energization of the active region takes place even in the recesses depends in particular on the transverse conductivity of the semiconductor layer 21 to be electrically contacted.

The lengthwise extent of the recesses may on the other hand also be very much greater than the crosswise extent, provided the smallest distance within the recesses to the closest location of the current spreading layer is no greater than the current spreading length in the semiconductor layer 21.

The recesses 35 result in regions on the radiation exit face 210 from which radiation is able to exit from the semiconductor device without having to pass through the entire thickness of the current spreading layer 3. This reduces the fraction of radiation absorbed overall in the semiconductor device. The lateral extent of the recesses is configured, in plan view onto the semiconductor device, such that, when the semiconductor device 1 is in operation, at every location in the recesses charge carriers may be injected via the semiconductor layer 21 into the active region 20. This prevents locations from being able to arise in the active region under the recesses 35 which are not energized and cause increased absorption during operation. Such absorption might more than compensate for the reduced absorption through the current spreading layer 3 due to the recesses 35.

By the patterning 31 of the current spreading layer 3, minimized radiation absorption and efficient charge carrier injection are thus combined.

Within the connection region 30, coverage with material of the current spreading layer 3 may be varied. As a measure of coverage with material of the current spreading layer, a square may, for example, be used which has an edge length which is greater than or equal to twice the crosswise extent of the recesses. This square shows different coverage at different locations of the connection region 30. FIG. 1A shows, by way of example, a first square area 81 and a second square area 82 of identical size, wherein the first square area 81 is closer to the closest border of the contact structure 4 than the second square area 82. Preferably, the recesses in the first square area fill at least 50% of the first square area and the recesses in the second square area fill at most 10% of the second square area.

Coverage with material of the current spreading layer 3 may, for example, increase in a linear manner or by a higher order of magnitude as the distance from the closest border of the contact structure 4 increases. For example, coverage increases proportionally to wherein x is the distance and 0≤n≤1. Regions which are close to the contact structure 4 and in which therefore comparatively major charge carrier injection into the active region 20 takes place via the semiconductor layer 21 therefore have comparatively low coverage with material of the current spreading layer 3. Due to the increased radiation emission in these regions, the absorption losses reduced by the recesses 35 here have a particularly favorable effect on the efficiency of the semiconductor device 1. Regions further away from the contact structure 4 are, on the other hand, less strongly energized due to the longer current path in the current spreading layer 3, in particular if the transverse conductivity of the semiconductor layer 21 is lower than the transverse conductivity of the further semiconductor layer 22.

By varying coverage with the current spreading layer 3 by the patterning 31, it is in particular possible to achieve a homogeneous current density and/or a homogeneous luminance.

Preferably, the patterning 31 of the current spreading layer 3 and the external border of the current spreading layer are free of angular edges. The risk of current and/or voltage peaks, which could lead to heating or even to destruction of the semiconductor device 1, is thus avoided.

The distance between the recesses 35 closest to the contact structure 4 and the contact structure 4 is preferably such that the recesses do not or at least do not significantly impair distribution of the current in the current spreading layer.

In the example of the patterning 31 shown in FIG. 2A, the recesses 35 are arranged in a matrix. The lengthwise extent of the recesses 35 extends perpendicular to the border of the closest contact structure 4. Current flow within the current spreading layer 3 in a preferential direction of the current between the contact structure 4 and the further contact structure 5 may thus extend continuously between the recesses 35. This keeps the current path small which the charge carriers have to cover in the current spreading layer 3 to energize the active region 20.

Unlike circular recesses with elongate, for example, elliptical recesses, the area of the recesses may be enlarged without the maximum distance to the closest location of the current spreading layer 3 increasing. For example, the point at maximum distance in an ellipse is the center point of the ellipse and the maximum distance corresponds to half the transverse axis of the ellipse.

Figure 2B:
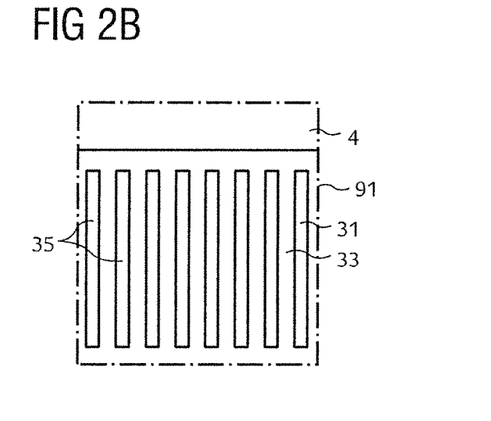
Figure 2C:
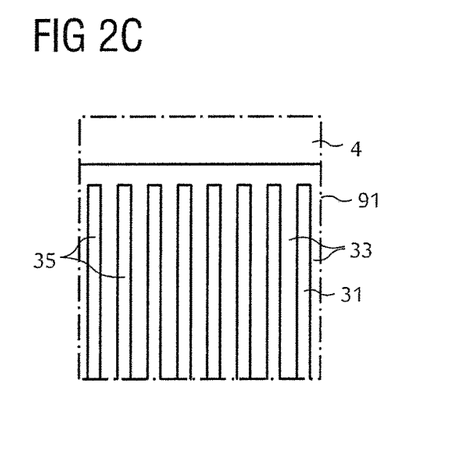

In the example shown in FIG. 2B, the recesses 35 are likewise of elongate configuration and have a trench-like basic shape. The trench-like recesses 35 extend parallel to one another such that ribs 33 of the current spreading layer 3 arise between these trenches. The trench-like recesses 35 may also, as in FIG. 2C, extend as far as the edge of the current spreading layer 3, resulting in places in a comb-like patterning 31.

Figure 2D:
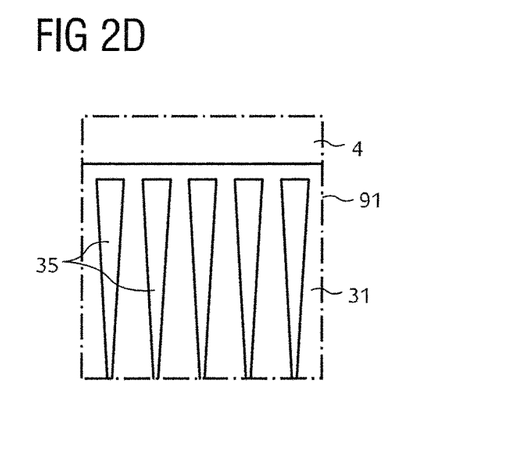

The crosswise extent of the trench-like recesses 35 and/or of the ribs 33 may also vary as shown in FIG. 2D. Preferably, a crosswise extent of the trench-like recesses decreases at least in places as the distance from the contact structure 4 increases. The radiation exit face 210 thus in turn has lower coverage with the current spreading layer 3 close to the contact structure 4 than in a region further away from the contact structure 4. The crosswise extent of the trench-like recesses and/or the crosswise extent of the ribs 33 may vary in the connection region, for example, by at least 50%.

FIGS. 2E to 2H show various configurations in which coverage with material of the current spreading layer 3 is varied. In the example according to FIGS. 2E and 2F, coverage varies by variation of the crosswise extent of the recesses 35. In the example shown, the recesses 35 are of circular construction. In contrast thereto, however, they may also have an elongate basic shape, for example, an elliptical basic shape.

Figure 2E:
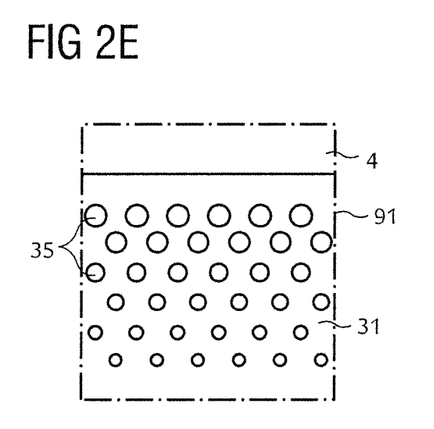
Figure 2F:
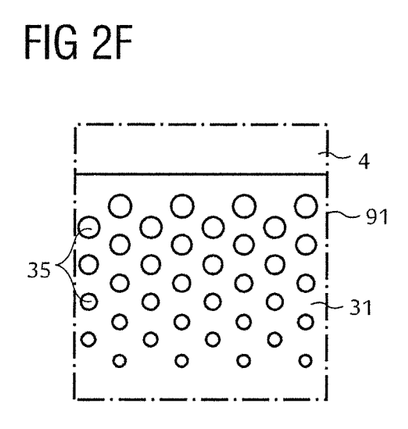
Figure 2G:
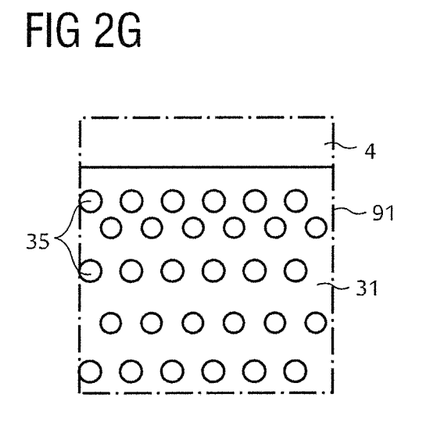
Figure 2H:
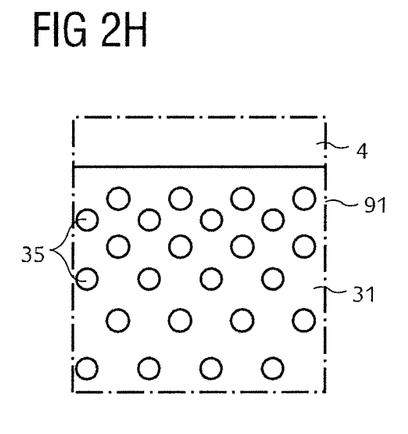

FIGS. 2G and 2H each show examples in which coverage varies by variation of the average distance between neighboring recesses 35. In the examples shown in FIGS. 2F and 2H, the recesses 35 are each arranged such that continuous current paths form between the recesses 35 perpendicular to the contact structure 4. This configuration conveys a local current flow along a preferential direction perpendicular to the closest contact structure 4.

The configurations shown in FIGS. 2E and 2G, in which parallel rows of recesses are arranged offset relative to one another along the contact structure 4 are suitable in particular for regions of the current spreading layer in which there is no preferential direction perpendicular to the contact structure 4. As a result of the arrangement shown of the recesses, which corresponds locally at least approximately to a hexagonal grid, the density of the recesses increases at a constant distance between neighboring recesses.

Figure 2I:
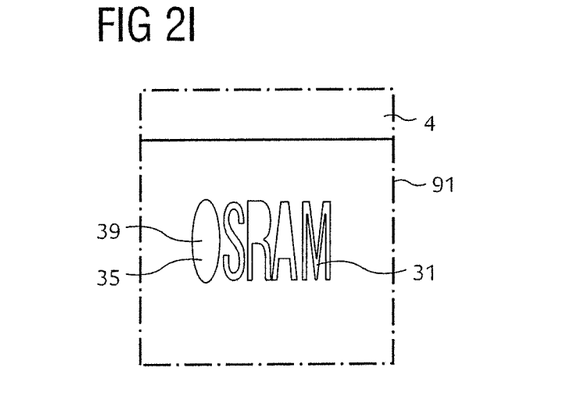
Figure 2J:
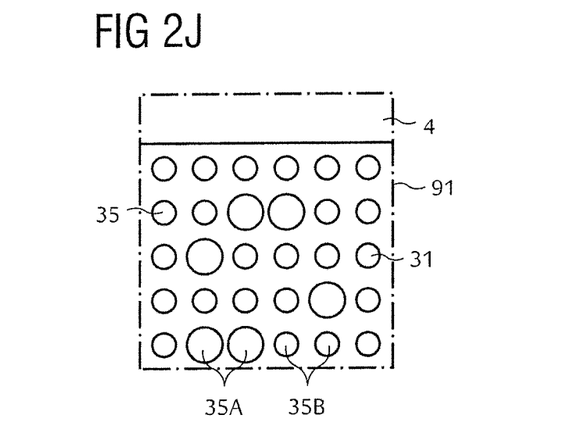

FIGS. 21 and 2J show two examples in which optical information 39 is formed by the patterning 31. In the example shown in FIG. 21, the optical information 39 is formed by letters, in the example shown by a character string "OSRAM." Other types of letters, characters or graphical symbols such as logos are also suitable as optical information. Preferably, the letters or elements are configured such that they have only a slight effect on current flow in the current spreading layer. In the example shown, the individual letters each have an elongate shape perpendicular to the contact structure 4.

In the example shown in FIG. 2J, the patterning 31 comprises a plurality of first recesses 35a and a plurality of second recesses 35b, which differ in size and are arranged in a matrix. These two different types of recess allow optical information to be encoded in digital form.

By purposeful variation of the area and/or shape of the recesses, optical information can therefore be represented without this having to have a major effect on the performance of the semiconductor device.

The optical information is particularly suitable for traceability of the semiconductor devices produced and may, for example, contain information relating to production, for example, relating to the manufacturer itself to the batch or to the position of the produced semiconductor chip on the wafer from which it originates. For example, 16 bit information, i.e., information about 65,536 different positions on the wafer, can be indicated by 16 recesses.

The information may also be encoded in another form, for example, by varying the shape of the recesses. Furthermore, it is possible, for example, with elongate recesses, for instance trench-like recesses to encode optical information in the form of a barcode.

Figure 3:
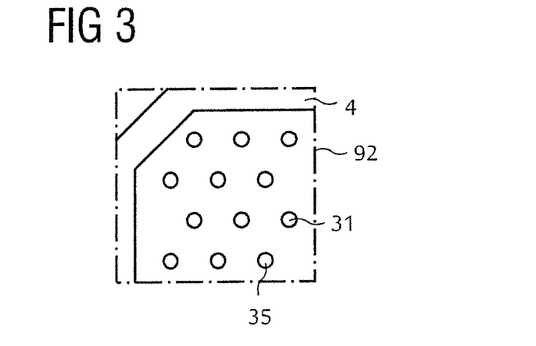
FIG. 3 shows an example of a patterning on the basis of a further portion 92 of FIG. 1A.

FIG. 3 shows an example of a patterning on the basis of a further portion 92. This further portion 92 is located in a region of the current spreading layer 3 in which the adjacent contact structure 4 does not extend in a straight line throughout. The contact structure 4 comprises two kinks. In such a region no large-area uniform preferential direction is established for the current flow within the current spreading layer.

In such regions, an arrangement of recesses in a pattern having no significant current effect, for example, a honeycomb pattern, is, for example, particularly suitable.

Figure 4:
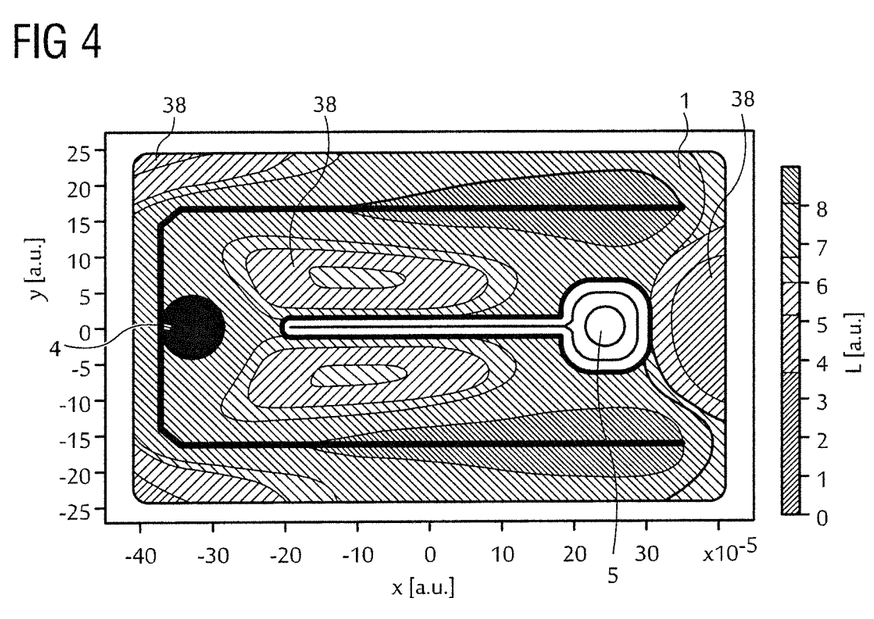
FIG. 4 shows a luminance distribution of a semiconductor device.

FIG. 4 is a schematic diagram of the luminance distribution L of a semiconductor device without patterning of a current spreading layer. The luminance L and the dimensions along the x axis and the y axis are expressed in arbitrary units (a.u.).

In various regions of the semiconductor device 1 it is possible, as shown in FIG. 4, to dispense deliberately with formation of a current spreading layer 3. This is convenient in particular for peripheral regions or corner regions, in which, due to the arrangement of the contact regions, only comparatively slight charge carrier injection into the underlying active region would take place even if a current spreading layer were provided. This may also be convenient for inner regions in which only slight charge carrier injection would take place. These are, for example, regions of the semiconductor device in which current density is below 20% of the average current density. Free regions 38 at these locations may increase outcoupling of the radiation generated, which may arise at any desired position within the active region 20.

This application claims priority of DE 10 2014 108 300.8, the subject matter of which is hereby incorporated by reference.

Our devices are not restricted by the description given with reference to the examples. Rather, the disclosure encompasses any novel feature and any combination of features, including in particular any combination of features in the appended claims, even if the feature or combination is not itself explicitly indicated in the claims or the examples.

The invention claimed is:

1. An optoelectronic semiconductor device having a semiconductor body comprising a semiconductor layer sequence with an active region that generates radiation, a semiconductor layer and a further semiconductor layer, wherein
   the active region is arranged between the semiconductor layer and the further semiconductor layer;
   a current spreading layer is arranged on a radiation exit face of the semiconductor body;
   the current spreading layer connects electrically conductively to a contact structure for external electrical contacting of the semiconductor layer;
   in a plan view of the semiconductor device, the current spreading layer adjoins the semiconductor layer in a connection region;
   the current spreading layer comprises a patterning with a plurality of recesses through which radiation exits the semiconductor device during operation; and
   the patterning comprises trench-shaped recesses with ribs of the current spreading layer extending between the trench-shaped recesses and a crosswise extent of the trench-shaped recesses decreases at least in places as the distance from the contact structure increases.

2. The semiconductor device according to claim 1, wherein an area of the recesses and/or a center-to-center distance of the recesses varies, when viewed in the plan view of the semiconductor device.

3. The semiconductor device according to claim 1, wherein the recesses do not extend right through the current spreading layer in a vertical direction extending perpendicular to the main plane of extension of the semiconductor layer sequence.

4. The semiconductor device according to claim 1, wherein the recesses take the form of cutouts extending through the current spreading layer.

5. The semiconductor device according to claim 1, wherein, in the plan view of the semiconductor device, the patterning contains optical information.

6. The semiconductor device according to claim 1, wherein the patterning comprises at least one first recess and one second recess, and the first recess and the second recess differ from one another in their base area in the plan view of the semiconductor device.

7. The semiconductor device according to claim 6, wherein the patterning comprises a plurality of first recesses and a plurality of second recesses and information is encoded by the first recesses and the second recesses.

8. The semiconductor device according to claim 1, wherein the patterning is configured such that, in a region in which current flow locally has a preferential direction in the current spreading layer, the patterning favors lateral current flow in the preferential direction.

9. The semiconductor device according to claim 1, wherein the patterning is configured such that, in a region in which a current flow is locally without a preferential direction, the patterning has no or at least no significant effect on the direction of the lateral current flow.

10. An optoelectronic semiconductor device having a semiconductor body comprising a semiconductor layer sequence with an active region that generates radiation, a semiconductor layer and a further semiconductor layer, wherein
    the active region is arranged between the semiconductor layer and the further semiconductor layer;
    a current spreading layer is arranged on a radiation exit face of the semiconductor body;
    the current spreading layer connects electrically conductively with a contact structure for external electrical contacting of the semiconductor layer;
    in a plan view of the semiconductor device the current spreading layer adjoins the semiconductor layer in a connection region;
    the current spreading layer comprises a patterning with a plurality of recesses through which radiation exits the semiconductor device during operation;
    the connection region comprises a first square area and a second square area, the first square area and the second square area are of equal size and each have an edge length which is greater than or equal to twice the crosswise extent of the recesses in the first square area, and
    in the plan view of the semiconductor device, the recesses in the first square area fill at least 20% of the first square area and the recesses in the second square area fill at most 10% of the second square area.

11. The semiconductor device according to claim 10, wherein the recesses are at least partly elongate when viewed in the plan view of the semiconductor device, and in a longitudinal direction the recesses have a lengthwise extent at least 20% greater than a crosswise extent in a transverse direction extending perpendicular to the longitudinal direction.

12. The semiconductor device according to claim 11, wherein the patterning comprises trench-shaped recesses with ribs of the current spreading layer extending between the trench-shaped recesses and a crosswise extent of the trench-shaped recesses decreases at least in places as the distance from the contact structure increases.

13. The semiconductor device according to claim 10, wherein the first area is arranged closer to a closest point of the contact structure than the second area.

14. The semiconductor device according to claim 10, wherein the crosswise extent is conformed to a transverse conductivity of the semiconductor layer such that, in the plan view of the semiconductor device, charge carriers are injected via the semiconductor layer into the active region at every location in the recesses during operation of the semiconductor device.

15. An optoelectronic semiconductor device having a semiconductor body comprising a semiconductor layer sequence with an active region that generates radiation, a semiconductor layer and a further semiconductor layer, wherein the active region is arranged between the semiconductor layer and the further semiconductor layer;

a current spreading layer is arranged on a radiation exit face of the semiconductor body;

the current spreading layer connects electrically conductively with a contact structure for external electrical contacting of the semiconductor layer;

in a plan view of the semiconductor device the current spreading layer adjoins the semiconductor layer in a connection region;

the current spreading layer comprises a patterning with a plurality of recesses through which radiation exits the semiconductor device during operation; and in a region of the semiconductor device in which a current density is below 20% of the average current density, the radiation exit face is free of the current spreading layer to increase the radiation outcoupling from the semiconductor device.

* * * * *